US008829922B2

(12) United States Patent
Balakrishnan et al.

(10) Patent No.: US 8,829,922 B2
(45) Date of Patent: Sep. 9, 2014

(54) ON-CHIP MEASUREMENT OF AC VARIABILITY IN INDIVIDUAL TRANSISTOR DEVICES

(75) Inventors: Karthik Balakrishnan, Cambridge, MA (US); Keith A. Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 588 days.

(21) Appl. No.: 13/029,214

(22) Filed: Feb. 17, 2011

(65) Prior Publication Data

US 2012/0212238 A1 Aug. 23, 2012

(51) Int. Cl.
G01R 27/28 (2006.01)
G01R 31/28 (2006.01)
G01R 31/26 (2014.01)

(52) U.S. Cl.
CPC ........ G01R 31/2621 (2013.01); G01R 31/2882 (2013.01)
USPC ..................................... 324/617; 324/765.01

(58) Field of Classification Search
CPC .......... G01R 31/2882; G01R 31/3004; G01R 31/2879
USPC ................ 714/699–726; 324/756.01–756.07, 324/500–537, 754.07, 762.01–762.09, 324/615–619, 769, 765.01; 327/100, 327/291–295
See application file for complete search history.

(56) References Cited

U.S. PATENT DOCUMENTS

| 6,057,691 | A | 5/2000 | Kobayashi |
| 6,069,849 | A | 5/2000 | Kingsley et al. |
| 6,219,305 | B1 | 4/2001 | Patrie et al. |
| 6,466,520 | B1 * | 10/2002 | Speyer et al. ................. 368/118 |
| 6,876,186 | B1 | 4/2005 | Gupta |
| 7,046,094 | B2 | 5/2006 | Belluomini et al. |
| 7,235,998 | B1 * | 6/2007 | Suzuki ..................... 324/762.09 |
| 7,268,575 | B1 * | 9/2007 | Chen et al. ............... 324/762.09 |
| 7,378,831 | B1 | 5/2008 | Jenkins et al. |
| 7,439,755 | B2 | 10/2008 | Jenkins et al. |
| 7,642,864 | B2 | 1/2010 | Chuang et al. |
| 7,679,458 | B2 * | 3/2010 | Malik ............................. 331/57 |
| 7,760,033 | B2 * | 7/2010 | Podmanik et al. ............... 331/57 |
| 2006/0044004 | A1 * | 3/2006 | Bhushan et al. ............... 324/769 |
| 2006/0114015 | A1 | 6/2006 | Furukawa |
| 2007/0252583 | A1 * | 11/2007 | Hokoiwa et al. ........... 324/158.1 |
| 2009/0063061 | A1 | 3/2009 | Bolam et al. |
| 2009/0267634 | A1 | 10/2009 | Nada et al. |

(Continued)

OTHER PUBLICATIONS

U.S. Appl. No. 12/894,334, filed Sep. 30, 2010.

(Continued)

Primary Examiner — Arleen M Vazquez
Assistant Examiner — Brent J Andrews
(74) Attorney, Agent, or Firm — Cantor Colburn LLP; Vazken Alexanian

(57) ABSTRACT

An apparatus for determining alternating current (AC) delay variation of a transistor device under test includes a ring oscillator, the ring oscillator having the transistor device under test configured within a feedback path of the ring oscillator; and circuitry configured to measure a difference between a first signal delay path and a second signal delay path, the first signal delay path being between a gate terminal and a drain terminal of the transistor device under test, and the second signal delay path being between a source terminal and the drain terminal of the transistor device under test.

20 Claims, 8 Drawing Sheets

(56) References Cited

U.S. PATENT DOCUMENTS

2010/0026352 A1* 2/2010 Jacobowitz et al. .......... 327/158
2010/0164531 A1* 7/2010 Marshall et al. .............. 324/766
2012/0081141 A1 4/2012 Jenkins et al.

OTHER PUBLICATIONS

A. Balankutty et al., "Mismatch Characterization of Ring Oscillators," IEEE Custom Integrated Circuits Conference, CICC '07, 2007, pp. 515-518.

R. Z. Bhatti et al., "Phase Measurement and Adjustment of Digital Signals Using Random Sampling Technique," Proceedings of the IEEE International Symposium on Circuits and Systems, May 2006, pp. 3886-3889.

H. O. Johansson, "A Simple Precharged CMOS Phase Frequency Detector," IEEE Journal of Solid-State Circuits, vol. 33, No. 2, 1998, pp. 295-299.

R. Rao et al., "A Local Random Variability Detector With Complete Digital On-Chip Measurement Circuitry," IEEE Journal of Solid-State Circuits, vol. 44, No. 9, Sep. 2009, pp. 2616-2623.

* cited by examiner

ON-CHIP MEASUREMENT OF AC VARIABILITY IN INDIVIDUAL TRANSISTOR DEVICES

BACKGROUND

The present invention relates generally integrated circuit devices and, more particularly, to on-chip measurement of AC variability in individual transistor devices, such as field effect transistors.

The aggressive scaling of transistor geometries to nanometer dimensions coupled with the growing die sizes has made it extremely difficult to maintain device uniformity while adjusting for the complex interactions between the numerous steps in the manufacturing process. The impact of these variations has been magnified with the scaling of design dimensions, since process tolerances do not scale proportionally, causing the relative impact of these variations to increase with each new technology generation. Variations in process-induced parameters can result in significant differences in the threshold voltage of devices, altering their characteristics and performance. Device variability can be caused by process and lithography imperfections, as well as uncontrollable factors such as random dopant fluctuations.

As a result, there is variation over different geometric length scales, such as lot-to-lot differences, across wafer variation, across-chip variation and local mismatch. The local mismatch is the most difficult to measure and control, as it requires substantial measurement to detect statistically significant variation in nearby devices.

Accurate characterization and measurement of local variation in threshold voltage of closely spaced devices is essential for process optimization, yield enhancement and design of analog circuits in current technologies. Threshold variation is a particularly acute problem for low supply voltage and sub-threshold logic circuits. Historically, characterization has been achieved through determination of current-voltage (I-V) curves of similar adjacent devices, each connected to measurement pads. Recently, multiplexing multiple devices to pads has greatly increased the number of devices which can be measured, but requires significant data analysis, in addition to accurate current measurement. The results of such measurements are regarded as direct current (DC) characteristics.

In contrast, there is a need to measure the time-dependent response of devices to transient changes of the voltages applied to devices. This can be regarded as alternating current (AC), high-frequency, or time-domain characterization. Ring oscillator-based circuits have been frequently used to characterize AC variability statistics, but they provide an average over perhaps hundreds of devices, and NFETs and PFETs are averaged together. Some other approaches require the generation of process-invariant bias voltages, which increases the area penalty and design complexity.

BRIEF SUMMARY

In an exemplary embodiment, an apparatus for determining alternating current (AC) delay variation of a transistor device under test includes a ring oscillator, the ring oscillator having the transistor device under test configured within a feedback path of the ring oscillator; and circuitry configured to measure a difference between a first signal delay path and a second signal delay path, the first signal delay path being between a gate terminal and a drain terminal of the transistor device under test, and the second signal delay path being between a source terminal and the drain terminal of the transistor device under test.

In another embodiment, an apparatus for determining alternating current (AC) delay variation of a plurality of transistor devices under test includes a plurality of ring oscillator units each including a ring oscillator, the ring oscillator having one of the plurality of transistor devices under test configured within a feedback path of the ring oscillator; for each ring oscillator unit, circuitry configured to measure a difference between a first signal delay path and a second signal delay path, the first signal delay path being between a gate terminal and a drain terminal of the transistor device under test, and the second signal delay path being between a source terminal and the drain terminal of the transistor device under test; and multiplexing circuitry configured to select one of the plurality of devices under test for determination of the difference between the first signal delay path and the second signal delay path.

In still another embodiment, a method for determining alternating current (AC) delay variation of a transistor device under test includes measuring a first signal delay path between a gate terminal and a drain terminal of the transistor device under test; measuring a second signal delay path being between a source terminal and the drain terminal of the transistor device under test, the transistor device under test being configured within a feedback path of a ring oscillator; and determining a difference between the first signal delay path and the second signal delay path.

BRIEF DESCRIPTION OF THE SEVERAL VIEWS OF THE DRAWINGS

Referring to the exemplary drawings wherein like elements are numbered alike in the several Figures.

DETAILED DESCRIPTION

As indicated above, in deeply scaled technologies, device variability in FETs has become an increasing concern. Variability in device characteristics such as saturation current, threshold voltage, and channel length has been well studied and various techniques have been proposed to measure them. However, there are other sources of device variability that are only at high frequencies, and which are not determined by the measurement of any of the aforementioned device characteristics. For example, any variability in the gate stack resistance may only be detected when signals are applied to the device at high frequencies. Therefore, a problem that is addressed by the embodiments herein is the characterization of device variability that only manifests itself at high frequencies.

Briefly stated, the embodiments described herein measure the AC variability of a set of nominally identical array of devices under test by configuring the devices as switches in ring oscillators. That is, each device under test acts as a pass gate switch for its own ring oscillator, where the oscillators are configured to operate in two different modes: a "pass" mode and a "wait" mode. The operating frequency of a given ring oscillator in each of the two modes may be measured, along with a delay measurement between two nodes, thus enabling characterization of the AC delay variation of the device under test, while canceling out any DC variation due to threshold voltage or channel length variability. Moreover, a set of such test structures will show the variation, if any, of the delays through the corresponding devices under test.

Figure 2:
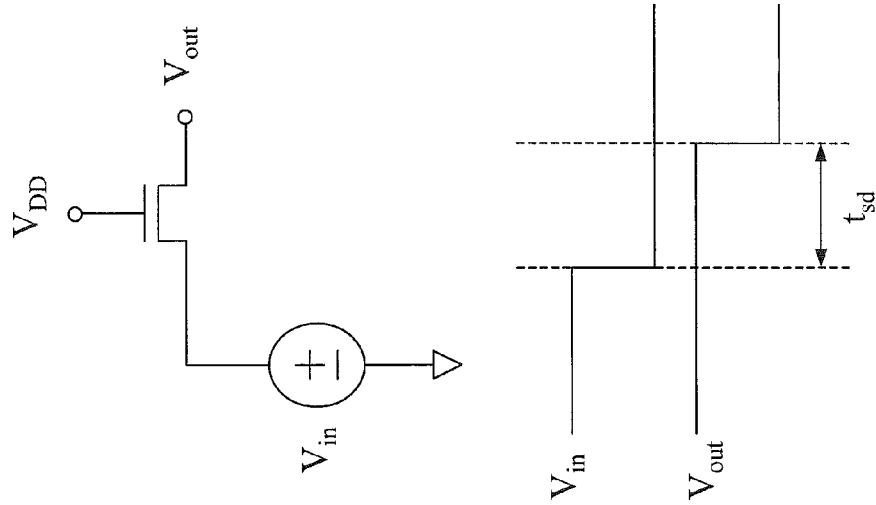
FIG. 2 is a schematic diagram illustrating an exemplary circuit test configuration that measures source-to-drain propagation delay, $t_{sd}$, respectively, of an NFET.
Figure 1:
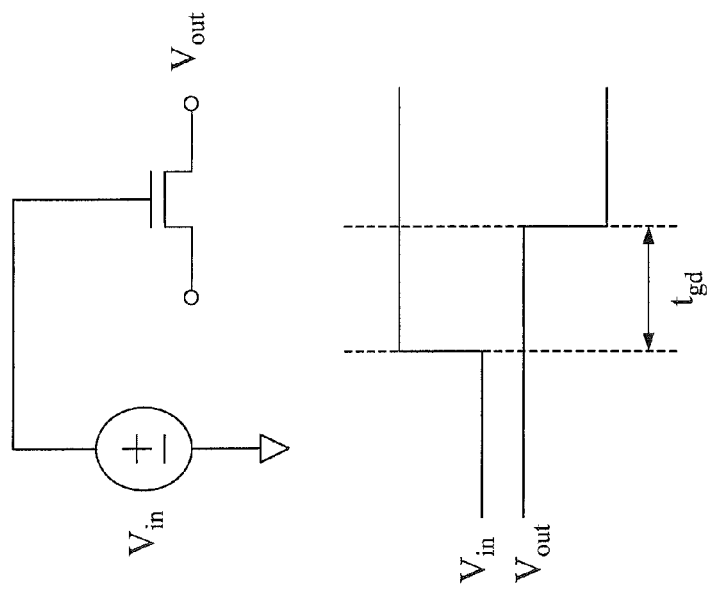
FIG. 1 is a schematic diagram illustrating an exemplary circuit test configuration that measures gate-to-drain propagation delay, $t_{gd}$, respectively, of an n-type FET (NFET)

More specifically, the embodiments described herein measure the difference between the gate-to-drain propagation delay, $t_{gd}$, and the source-to-drain propagation delay, $t_{sd}$, of a field effect transistor (FET). In this regard, FIGS. 1 and 2 are schematic diagrams of exemplary circuit test configurations that measure, respectively, $t_{gd}$ and $t_{sd}$, respectively, of an n-type FET (NFET). In the case of an NFET, the gate-to-drain propagation delay, $t_{gd}$, represents the time for the voltage ($V_{out}$) on the output node (drain) to transition from high to low once the input voltage on the gate ($V_{in}$) transitions from low to active high, as shown in FIG. 1. The source-to-drain propagation delay, $t_{sd}$, represents the time for the voltage ($V_{out}$) on the output node (drain) to transition from high to low once the voltage ($V_{in}$) on the input node (source) transitions from high to low, with the gate held active high, as shown in FIG. 2. By measuring the difference between these two metrics, it is possible to significantly decouple the variability of the FET device due to DC parameters from high-frequency variability. Accordingly, the source of such AC variability may be isolated.

Figure 3:
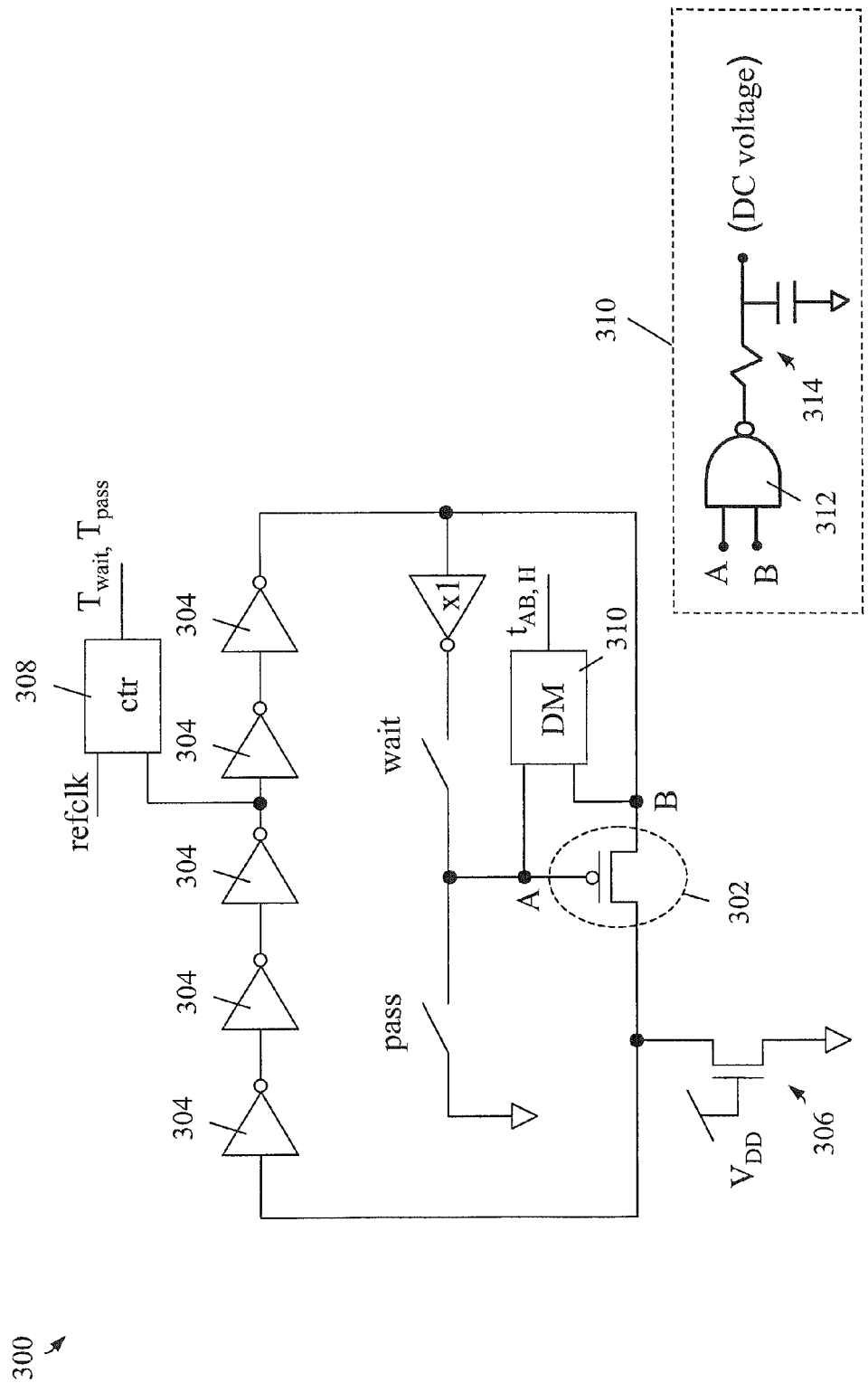
FIG. 3 is a schematic diagram illustrating a ring oscillator-based test structure configured to measure a difference between $t_{gd}$ and $t_{sd}$ of a PFET device under test in accordance with an exemplary embodiment.

Referring now to FIG. 3, there is shown a ring oscillator-based test structure 300 configured to measure a difference between $t_{gd}$ and $t_{sd}$, of a device under test 302 in accordance with an exemplary embodiment. This difference is referred to herein after as $t_{meas}$. In the exemplary embodiment depicted, the device under test (DUT) 302 is a p-type FET (PFET), however it will be appreciated that an n-type FET (NFET) may also be used with the appropriate adjustments made to the test structure 300, in the form of changes to the "pass" switch connection and transistor 306. As is shown in FIG. 3, the test structure 300 includes a ring oscillator having a plurality of serially connected, odd numbered inverter stages 304 wherein the DUT 302 is configured as a pass gate in a feedback path of the inverter stages 304.

A gate terminal of the DUT 302, also designated by node A in FIG. 3, is coupled to a switching mechanism that includes a first switch "pass" that selectively couples node A to ground (in this instance activating the PFET DUT 302, and a second switch "wait" that selectively couples node A to the feedback path of the inverter stages 304 through an inverter stage x1, wherein x1 may represent a single inverter or an odd number of coupled or chained inverter stages. Both the "pass" and "wait" switches may be implemented using, for example, complementary metal oxide semiconductor (CMOS) transmission gates.

Figure 4:
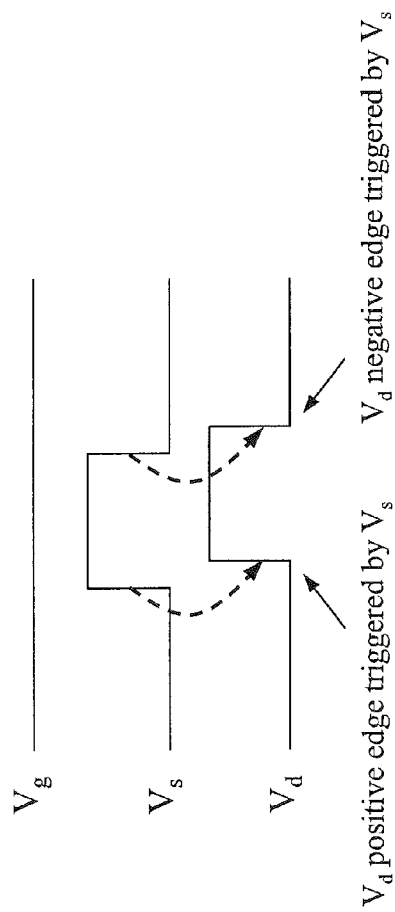
FIG. 4 is a series of waveform diagrams illustrating the operation of the test structure of FIG. 3 in a first ("pass") mode of operation.
Figure 5:
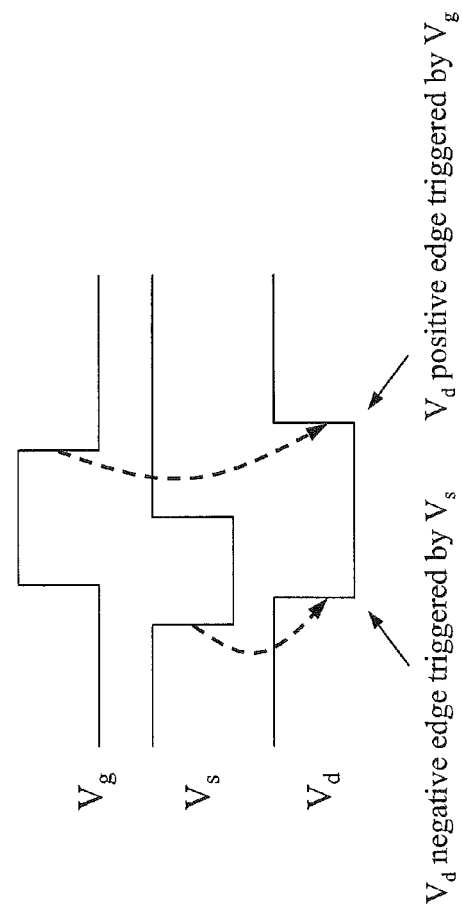
FIG. 5 is a series of waveform diagrams illustrating the operation of the test structure of FIG. 3 in a second ("wait") mode of operation.

A weak pull-down device 306 is used to enable the drain of the DUT 302 to swing rail-to-rail. However, other devices, such as a resistor for example, may be used for this purpose. When the "pass" switch is enabled, the ring oscillator operates at a frequency that depends on the $t_{sd}$ of the DUT 302 for both rising and falling edges. In contrast, when the "wait" switch is enabled, the ring oscillator frequency depends on both the falling edge $t_{sd}$ of the DUT 302 and the falling edge $t_{gd}$ of the DUT 302. FIGS. 4 and 5 illustrate the relevant waveforms during the pass and wait modes of operation, respectively.

The period (T) of oscillation of the test structure 300 during the "pass" mode of operation is shown in equation 1 below, while the period of oscillation during the wait mode of operation is shown in equation 2 below. The parameter $t_{inv}$ represents the inverter delay of one inverter stage 304 in the ring oscillator.

$$T_{pass} = \Sigma(t_{inv,L} + t_{inv,H}) + T_{sd,H} + t_{sd,L} \quad \text{(eq. 1)}$$

$$T_{wait} = \Sigma(t_{inv,L} + t_{inv,H}) + t_{gd,H} + t_{sd,L} + t_{AB,H} \quad \text{(eq. 2)}$$

The desired parameter, $t_{meas}$, is determined from three measurable outputs of the test structure 300 by equation 3 below, namely, from the period of oscillation of the test structure 300 during the "pass" mode of operation ($T_{pass}$), the period of oscillation during the wait mode of operation ($T_{wait}$), and a delay ($t_{AB,H}$) owing to the feedback portion of the wait circuitry (i.e., between nodes B and A) of FIG. 3.

$$t_{meas} = T_{wait} - T_{pass} - t_{AB,H} \quad \text{(eq. 3)}$$

Substituting equations 1 and 2 into equation 3 yields:

$$t_{meas} = t_{gd,H} - t_{sd,H} \quad \text{(eq. 4)}$$

Referring once again to FIG. 3, the period of oscillation of the ring oscillator during the pass and wait modes, $T_{pass}$ and $T_{wait}$, may be measured by an off-chip instrument, such as a frequency counter, or, alternatively, using an on-chip frequency counter 308 implemented with a known reference clock (refclk). The delay $t_{AB,H}$ can be measured, for example, using a delay measurement (DM) circuit 310 such as by DC voltage conversion of duty cycle using a NAND gate 312 followed by an RC filter 314. Alternatively, the DM circuit 310 may be embodied by a true single phase flip-flop based phase-frequency detector (not shown), or any suitable other time delay measurement circuits (not shown). Thus, it will be seen that all three parameters on the right-hand side of equation 3 may be measured using the test structure 300, and as a result, the desired AC variability parameter $t_{meas}$ may be determined.

Figure 6:
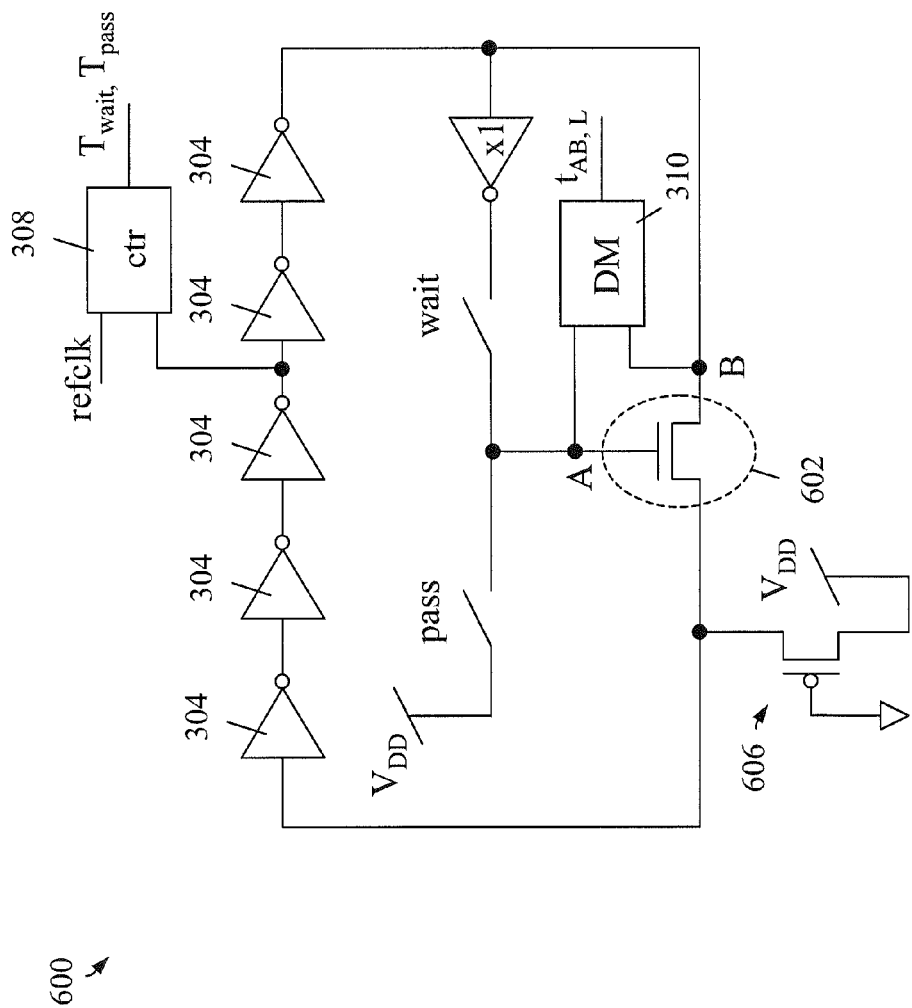
FIG. 6 is a schematic diagram illustrating a ring oscillator-based test structure configured to measure a difference between $t_{gd}$ and $t_{sd}$ of an NFET device under test in accordance with another exemplary embodiment.
Figure 7:
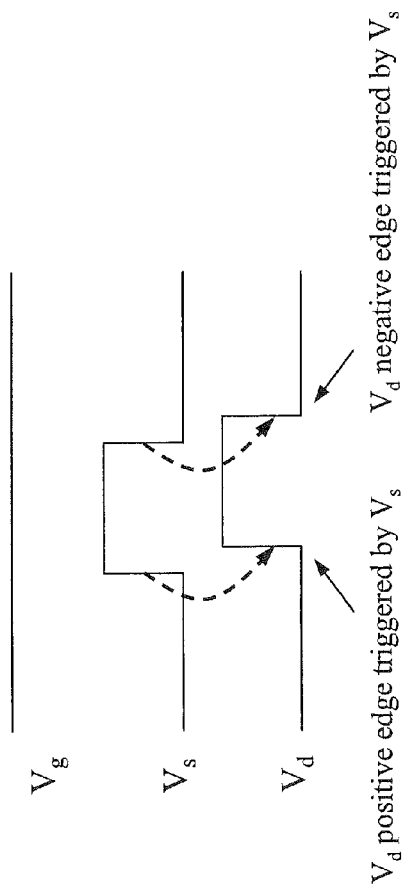
FIG. 7 is a series of waveform diagrams illustrating the operation of the test structure of FIG. 6 in the pass mode of operation.
Figure 8:
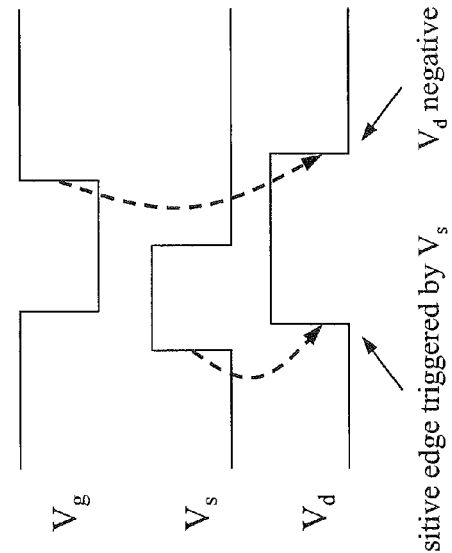
FIG. 8 is a series of waveform diagrams illustrating the operation of the test structure of FIG. 6 in the wait mode of operation.

As indicated above, the test structure 300 may be adapted to test an NFET device. In this regard, FIG. 6 is a schematic diagram illustrating a ring oscillator-based test structure 600 configured to measure a difference between $t_{gd}$ and $t_{sd}$ of an NFET device under test 602 in accordance with another exemplary embodiment. As will be noted, the configuration of the test structure 600 is substantially similar to that of the test structure 300 of FIG. 3. Here, in the pass mode of operation, the gate of NFET DUT 602 is coupled to VDD instead of ground. In addition, a weak pull-up device 606 is used to enable the drain of the DUT 602 to swing rail-to-rail. However, other devices, such as a resistor for example, may be used for this purpose. When the "pass" switch is enabled, the ring oscillator operates at a frequency that depends on the $t_{sd}$ of the DUT 602 for both rising and falling edges. In contrast, when the "wait" switch is enabled, the ring oscillator frequency depends on both the falling edge $t_{sd}$ of the DUT 602 and the rising edge $t_{gd}$ of the DUT 602. FIGS. 7 and 8 illustrate the relevant waveforms during the pass and wait modes of operation, respectively.

Equations 5 through 8 below are the NFET equivalents of equations 1 through 4 above describing the PFET DUT example:

$$T_{pass} = \Sigma(t_{inv,L} + t_{inv,H}) + T_{sd,H} + t_{sd,L} \quad \text{(eq. 5)}$$

$$T_{wait} = \Sigma(t_{inv,HL} + t_{inv,LH}) + t_{gd,L} + t_{sd,H} + t_{AB,L} \quad \text{(eq. 6)}$$

$$t_{meas} = T_{wait} - T_{pass} - t_{AB,L} \quad \text{(eq. 7)}$$

$$t_{meas} = t_{gd,L} - t_{sd,L} \quad \text{(eq. 8)}$$

Figure 9:
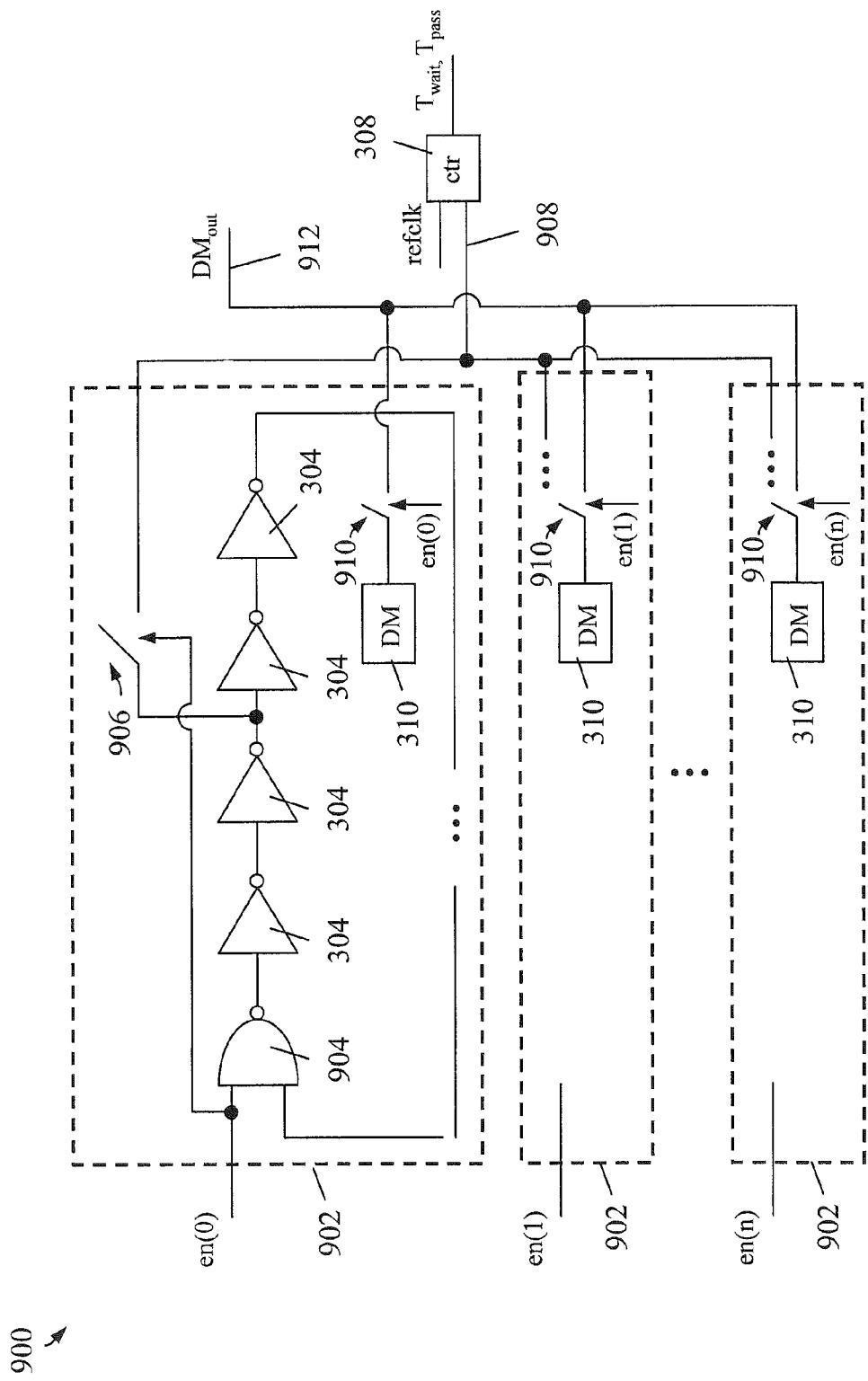
FIG. 9 is schematic diagram of a test circuit featuring a multiplexing scheme in which a plurality offing oscillators are used.

As a practical matter, in order to obtain statistics on the quantity $t_{meas}$ for several DUTs, several ring oscillators are correspondingly implemented. That is, each DUT is placed in its own ring oscillator circuit. FIG. 9 is schematic diagram of a test circuit 900 featuring a multiplexing scheme in which several ("n") ring oscillator units 902 are used. In this implementation, each ring oscillator within a unit 902 is enabled by using a NAND gate 904 in lieu of one of the ring oscillator inverter stages 304, wherein one of the inputs to the NAND gate 604 is the oscillator signal, and the other input is an enable signal, en(0), en(1), . . . , en(n), that selectively activates one of the oscillator units 902. In addition, the enable signal also controls a transmission gate switch 906 associated with each ring oscillator to determine which oscillator frequency/period will be measured at the global output 908 to the frequency counter 308. Furthermore, as also depicted in FIG. 9, the multiplexing enable signal, en(0), en(1), . . . , en(n), may also be used to propagate the delay measurement output signal, via a corresponding transmission gate switch 910 for each ring oscillator, to a global $DM_{out}$ signal 912.

Figure 10:
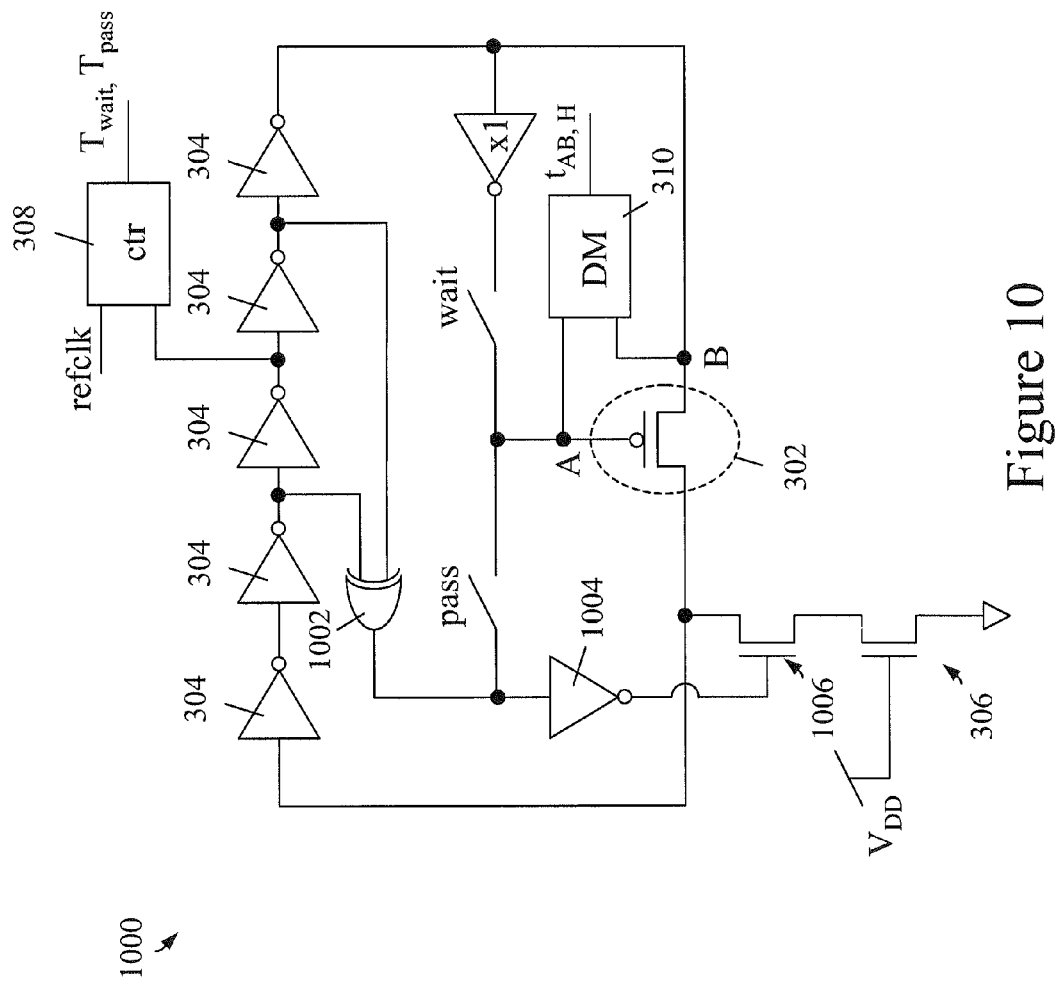
FIG. 10 is a schematic diagram illustrating a ring oscillator-based test structure configured to measure a difference between $t_{gd}$ and $t_{sd}$, of a PFET device under test for silicon-on-insulator (SOI) substrates, in accordance with another exemplary embodiment.

Referring now to FIG. 10, there is shown a schematic diagram illustrating a ring oscillator-based test structure 1000 configured to measure a difference between $t_{gd}$ and $t_{sd}$ of a device under test for silicon-on-insulator (SOI) substrates, in accordance with another exemplary embodiment. For the exemplary embodiment depicted, a PFET DUT 302 is used as in FIG. 3, but it will be appreciated that the test structure 1000 of FIG. 10 is equally applicable to an NFET DUT such as shown in FIG. 6.

In SOI technologies, the quantity $t_{meas}$ has a history effect component to it since the average floating gate-to-body voltage on the DUT during the pass and wait modes of operation is different. Whereas in the pass mode for a PFET device the gate voltage is held at 0V, in the wait mode the gate voltage alternates between 0V and VDD with a duty cycle slightly greater than 50%. Thus, in order to produce substantially the same duty cycle during the pass mode while not altering the circuit operation, an exclusive OR (XOR) gate 1002 may be configured between two of the ring oscillator stages with the output thereof coupled to the "pass" switch. This artificially creates a duty cycle of about 50% for the DUT gate voltage, but in so doing does not functionally alter the pass mode of operation. During those times where the output of XOR gate 1002 is high, an inverter 1004 and NFET switch 1006 disables the pull down device 306 and prevents the drain voltage of the DUT 302 from being reset to ground in the pass mode. Logically, where the DUT 302 is a PMOS device as in the example of FIG. 10, the two inputs to the XOR gate are separated by an even number of inverter stages (e.g., 2, 4, 6, etc.) so as to nominally be logically equivalent, save for the propagation delay of the oscillator signal through those particular stages in the overall oscillator cycle time. On the other hand, where the DUT is an NMOS device, the input to the XOR gate would be separated by an odd number of stages (e.g., 1, 3, 5, etc.) Alternatively an exclusive NOR (XNOR) gate could also be used for this function. Here, the inputs would be separated by an odd number of stages for a PMOS DUT and an even number of stages for an NMOS DUT.

Figure 11:
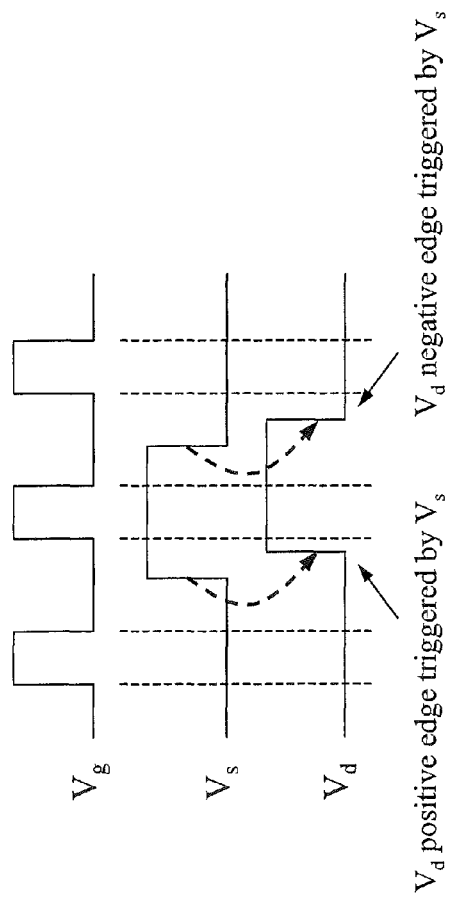
FIG. 11 is a series of waveform diagrams illustrating the operation of the test structure of FIG. 10 in the pass mode of operation.
Figure 12:
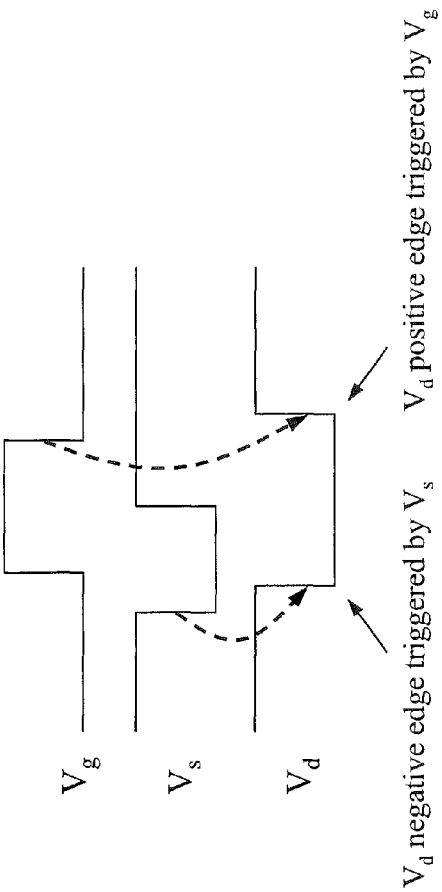
FIG. 12 is a series of waveform diagrams illustrating the operation of the test structure of FIG. 10 in the wait mode of operation.

As can be seen in the waveform diagram of FIG. 11, the duty cycle transitions of $V_g$ going inactive high occur at points in time where there are no transitions of either $V_s$ or $V_g$. Stated another way, both the positive and negative transitions of $V_s$ leading to delayed positive and negative transitions of $V_d$ all occur when $V_g$ is active low for the SOI compensated embodiment. Finally, as shown in the waveform diagrams of FIG. 12, the wait mode signal transitions for the SOI compensation embodiment of FIG. 10 are the same as that shown in FIG. 5.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for determining alternating current (AC) delay variation of a transistor device under test, comprising:
    a ring oscillator, the ring oscillator having the transistor device under test configured within a feedback path of the ring oscillator; and
    circuitry configured to measure a difference between a first signal delay path and a second signal delay path, the first signal delay path being between a gate terminal and a drain terminal of the transistor device under test such that a gate-to-drain propagation delay, $t_{gd}$, represents the time for a drain voltage on the drain terminal to transition between logic states after a gate voltage on the gate terminal transitions between logic states, and the second signal delay path being between a source terminal and the drain terminal of the transistor device under test such that a source-to-drain propagation delay, $t_{sd}$, represents the time for the drain voltage to transition between logic stages after a source voltage on the source terminal transitions between logic states.

2. The apparatus of claim 1, further comprising:
    a switching mechanism configured to selectively implement measurement of the second signal delay path by configuring the transistor device under test such that the ring oscillator operates at a frequency dependent upon a rising edge signal transition at the source terminal and a falling edge signal transition at the source terminal; and the switching mechanism is configured to selectively implement measurement of the first signal delay path by configuring the transistor device under test such that the ring oscillator operates at a frequency dependent upon a signal transition at the source terminal and a signal transition at the gate terminal.

3. The apparatus of claim 2, wherein the switching mechanism further comprises:
a first switch that selectively couples the gate terminal of the transistor device under test to a power rail so as to place the transistor device under test in a pass gate mode of operation; and
a second switch that selectively couples the gate terminal of the transistor device under test to the feedback path of the ring oscillator via an inverter or an odd-numbered chain of inverters.

4. The apparatus of claim 3, wherein:
the transistor device under test is a p-type field effect transistor (PFET); and
the switching mechanism is configured to selectively implement measurement of the first signal delay path by configuring the PFET such that the ring oscillator operates at a frequency dependent upon a falling edge signal transition at the source terminal and a falling edge signal transition at the gate terminal.

5. The apparatus of claim 4, further comprising a pull-down device configured to enable the drain terminal of the PFET to swing rail-to-rail.

6. The apparatus of claim 3, wherein:
the transistor device under test is an n-type field effect transistor (NFET); and
the switching mechanism is configured to selectively implement measurement of the first signal delay path by configuring the NFET such that the ring oscillator operates at a frequency dependent upon a rising edge signal transition at the source terminal and a rising edge signal transition at the gate terminal.

7. The apparatus of claim 6, further comprising a pull-up device configured to enable the drain terminal of the NFET to swing rail-to-rail.

8. The apparatus of claim 2, wherein the switching mechanism further comprises:
a first switch that selectively couples the gate terminal of the transistor device under test to an output of an exclusive OR (XOR) logic gate, the XOR logic gate having inputs coupled to different stages of the ring oscillator, so as to place the transistor device under test in a pass gate mode of operation; and
a second switch that selectively couples the gate terminal of the transistor device under test to the feedback path of the ring oscillator via an inverter or an odd-numbered chain of inverters.

9. The apparatus of claim 8, wherein the pass gate mode operation has a duty cycle in which the output of the XOR logic gate interrupts activation of the gate terminal of the transistor device under test, corresponding to times during which there are no signal transitions at the source terminal of the transistor device under test.

10. The apparatus of claim 2, further comprising:
a frequency measurement device coupled to the ring oscillator, the frequency measurement device configured to determine a first period of oscillation, $T_{pass}$, of the ring oscillator during measurement of the first signal delay path, and to determine a second period of oscillation, $T_{wait}$, of the ring oscillator during measurement of the second signal delay path; and
a delay measurement device coupled to the gate and source terminals of the transistor device under test, the delay measurement device configured to measure a delay caused by the ring oscillator feedback path coupling to the transistor device under test;
wherein the difference between a first signal delay path and a second signal delay path comprises ($T_{wait} - T_{pass}$) minus the delay caused by the ring oscillator feedback path coupling to the transistor device under test.

11. An apparatus for determining alternating current (AC) delay variation of a plurality of transistor devices under test, comprising:
a plurality of ring oscillator units each including a ring oscillator, the ring oscillator having one of the plurality of transistor devices under test configured within a feedback path of the ring oscillator;
for each ring oscillator unit, circuitry configured to measure a difference between a first signal delay path and a second signal delay path, the first signal delay path being between a gate terminal and a drain terminal of the transistor device under test such that a gate-to-drain propagation delay, $t_{gd}$, represents the time for a drain voltage on the drain terminal to transition between logic states after a gate voltage on the gate terminal transitions between logic states, and the second signal delay path being between a source terminal and the drain terminal of the transistor device under test such that a source-to-drain propagation delay, $t_{sd}$, represents the time for the drain voltage to transition between logic stages after a source voltage on the source terminal transitions between logic states; and
multiplexing circuitry configured to select one of the plurality of devices under test for determination of the difference between the first signal delay path and the second signal delay path.

12. The apparatus of claim 11, wherein each ring oscillator unit further comprises:
a switching mechanism configured to selectively implement measurement of the second signal delay path by configuring the transistor device under test such that the ring oscillator operates at a frequency dependent upon a rising edge signal transition at the source terminal and a falling edge signal transition at the source terminal;
wherein the switching mechanism is configured to selectively implement measurement of the first signal delay path by configuring the transistor device under test such that the ring oscillator operates at a frequency dependent upon a signal transition at the source terminal and a signal transition at the gate terminal.

13. The apparatus of claim 12, wherein the switching mechanism further comprises:
a first switch that selectively couples the gate terminal of the transistor device under test to a power rail so as to place the transistor device under test in a pass gate mode of operation; and
a second switch that selectively couples the gate terminal of the transistor device under test to the feedback path of the ring oscillator via an inverter.

14. The apparatus of claim 13, wherein:
at least one of the plurality of transistor devices under test is a p-type field effect transistor (PFET);
wherein the switching mechanism is configured to selectively implement measurement of the first signal delay path by configuring the PFET such that the ring oscillator operates at a frequency dependent upon a falling edge signal transition at the source terminal and a falling edge signal transition at the gate terminal.

15. The apparatus of claim 14, further comprising a pull-down device configured to enable the drain terminal of the PFET to swing rail-to-rail.

16. The apparatus of claim 13, wherein:
at least one of the plurality of transistor devices under test is an n-type field effect transistor (NFET);
wherein the switching mechanism is configured to selectively implement measurement of the first signal delay path by configuring the NFET such that the ring oscillator operates at a frequency dependent upon a rising edge signal transition at the source terminal and a rising edge signal transition at the gate terminal.

17. The apparatus of claim 16, further comprising a pull-up device configured to enable the drain terminal of the NFET to swing rail-to-rail.

18. The apparatus of claim 12, wherein the switching mechanism further comprises:
a first switch that selectively couples the gate terminal of the transistor device under test to an output of an exclusive OR (XOR) logic gate, the XOR logic gate having inputs coupled to different stages of the ring oscillator, so as to place the transistor device under test in a pass gate mode of operation; and
a second switch that selectively couples the gate terminal of the transistor device under test to the feedback path of the ring oscillator via an inverter.

19. The apparatus of claim 18, wherein the pass gate mode operation has a duty cycle in which the output of the XOR logic gate interrupts activation of the gate terminal of the transistor device under test, corresponding to times during which there are no signal transitions at the source terminal of the transistor device under test.

20. The apparatus of claim 12, further comprising:
a frequency measurement device associated with the plurality of ring oscillator units such that the multiplexing circuitry selectively couples the frequency measurement devices to a selected ring oscillator, the frequency measurement device configured to determine a first period of oscillation, $T_{pass}$, of the ring oscillator during measurement of the first signal delay path, and to determine a second period of oscillation, $T_{wait}$, of the ring oscillator during measurement of the second signal delay path; and
a delay measurement device coupled to the gate and source terminals of the transistor device under test, the delay measurement device configured to measure a delay caused by the ring oscillator feedback path coupling to the transistor device under test;
wherein the difference between a first signal delay path and a second signal delay path comprises ($T_{wait}-T_{pass}$) minus the delay caused by the ring oscillator feedback path coupling to the transistor device under test.

* * * * *